(12) United States Patent
Totsuka (10) Patent No.: US 12,191,201 B2
(45) Date of Patent: Jan. 7, 2025

(54) SEMICONDUCTOR DEVICE AND METHOD FOR MANUFACTURING SEMICONDUCTOR DEVICE

(71) Applicant: Mitsubishi Electric Corporation, Tokyo (JP)

(72) Inventor: Masahiro Totsuka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 457 days.

(21) Appl. No.: 17/755,080

(22) PCT Filed: Mar. 16, 2020

(86) PCT No.: PCT/JP2020/011478
§ 371 (c)(1),
(2) Date: Apr. 20, 2022

(87) PCT Pub. No.: WO2021/186503
PCT Pub. Date: Sep. 23, 2021

(65) Prior Publication Data
US 2022/0293468 A1 Sep. 15, 2022

(51) Int. Cl.
*H01L 21/768* (2006.01)
*C23C 16/02* (2006.01)
(Continued)

(52) U.S. Cl.
CPC .... *H01L 21/76879* (2013.01); *C23C 16/0272* (2013.01); *C23C 16/045* (2013.01);
(Continued)

(58) Field of Classification Search
CPC ............................................. C23C 16/0272
See application file for complete search history.

(56) References Cited

U.S. PATENT DOCUMENTS

2007/0246735 A1 10/2007 Yahata et al.
2009/0315182 A1* 12/2009 Besser .............. H01L 21/76889
257/754
(Continued)

FOREIGN PATENT DOCUMENTS

JP    H11-040515 A      2/1999
JP    2006086183 A  *   3/2006    ......... H01L 21/0485
(Continued)

OTHER PUBLICATIONS

Machine language translation of JP 2006086183-A (Year: 2006).*
International Search Report issued in PCT/JP2020/011478; mailed Jun. 23, 2020.

*Primary Examiner* — Erik Kielin
(74) *Attorney, Agent, or Firm* — Studebaker & Brackett PC (57) ABSTRACT

An adhesive layer (18) in which the same number of first and second layers (14,16) having conductivity are alternately laminated in order on a semiconductor substrate (10). A metal layer (24) is formed on the adhesive layer (18). The first layer (14) is composed of a material containing an element composing the semiconductor substrate (10). The second layer (16) has higher adhesion to the metal layer (24) than the first layer (14). The adhesive layer (18) has four or more layers including the first and second layers (14,16). Among the first layers (14) and the second layers (16) constituting the adhesive layer (18), excluding the second layer (16) contacting the metal layer (24), the first layer (14) contacting the semiconductor substrate (10) has the largest film thickness, and excluding the first layer (14) contacting the semiconductor substrate (10), the second layer (16) contacting the metal layer (24) has the largest film thickness.

6 Claims, 6 Drawing Sheets

(51) Int. Cl.
*C23C 16/04* (2006.01)
*C23C 16/455* (2006.01)
*H01L 21/48* (2006.01)

(52) U.S. Cl.
CPC ...... C23C 16/45525 (2013.01); H01L 21/486 (2013.01); H01L 21/76876 (2013.01)

(56) References Cited

U.S. PATENT DOCUMENTS

| | | | |
|---|---|---|---|
| 2011/0020998 A1* | 1/2011 | Oh | H10N 70/8828 |
| | | | 438/381 |
| 2012/0126250 A1* | 5/2012 | Tamaso | H01L 29/66068 |
| | | | 257/77 |
| 2014/0117549 A1 | 5/2014 | Tsunami et al. | |
| 2017/0084742 A1* | 3/2017 | Rubin | H01L 29/66553 |

FOREIGN PATENT DOCUMENTS

| | | |
|---|---|---|
| JP | 2007-266376 A | 10/2007 |
| JP | 2007-300063 A | 11/2007 |
| JP | 2014-112634 A | 6/2014 |

* cited by examiner

SEMICONDUCTOR DEVICE AND METHOD FOR MANUFACTURING SEMICONDUCTOR DEVICE

FIELD

The present disclosure relates to a semiconductor device and a method for manufacturing the semiconductor device.

BACKGROUND

A semiconductor device in which an adhesive layer is sandwiched between a semiconductor substrate and a metal layer is disclosed (see, e.g., PTL 1). The adhesive layer is sandwiched between the semiconductor substrate and the metal layer so that adhesion therebetween is enhanced.

CITATION LIST

Patent Literature

[PTL 1] JP 2014-112634 A

SUMMARY

Technical Problem

However, in the above-described semiconductor device, the adhesion between the semiconductor substrate and the metal layer may not be sufficient. If the semiconductor substrate is composed of SiC, for example, when Ti or Ni to be commonly used is used for the adhesive layer, the adhesion between the semiconductor substrate and the adhesive layer is not sufficient. This is because adhesion between SiC and Ti or Ni is not sufficient.

To solve a problem that the adhesion is not sufficient, the adhesive layer may be made to have a two-layer structure. Out of two layers, the layer (first layer) that contacts the semiconductor substrate is formed of a material having high adhesion to the semiconductor substrate, and the layer (second layer) that contacts the metal layer is formed of a material having high adhesion to the metal layer. However, in this case, only one interface is formed in the adhesive layer. Thus, when a stress is applied to the adhesive layer, like when the semiconductor substrate is warped, the stress concentrates on the one interface. The stress concentration leads to film peeling, film floating, or the like at this interface. That is, the adhesion between the semiconductor substrate and the metal layer deteriorates.

To solve a problem of the deterioration in the adhesion, when the adhesive layer is made to have a structure in which first layers and second layers are alternately formed, and a plurality of interfaces are formed in the adhesive layer, the stress concentration may be prevented. However, in this case, the film thickness of the adhesive layer increases because the number of films increases, and an electrical resistance in a film thickness direction of the adhesive layer increases. When the respective film thicknesses of the first layer and the second layer are reduced to keep the film thickness of the adhesive layer small, a component of the second layer, in turn, moves to the vicinity of the interface between the semiconductor substrate and the first layer due to diffusion or the like, resulting in deterioration in adhesion at this interface. This problem also similarly occurs in the interface between the metal layer and the second layer.

The present disclosure has been made to solve the above-described problem, and is directed to obtaining a semiconductor device capable of keeping an adhesive layer thin while preventing adhesion between a semiconductor substrate and a metal layer from deteriorating and a method for manufacturing the semiconductor device.

Solution to Problem

A semiconductor device according to the present disclosure includes: a semiconductor substrate including a first surface and a second surface that oppose each other; an adhesive layer in which the same number of first and second layers having conductivity are alternately laminated in order on the first surface; and a metal layer formed on the adhesive layer, wherein the first layer is composed of a material containing an element composing the semiconductor substrate, the second layer has higher adhesion to the metal layer than that of the first layer, the adhesive layer has four or more layers including the first and second layers, among the first layers and the second layers constituting the adhesive layer, excluding the second layer that contacts the metal layer, the first layer that contacts the semiconductor substrate has the largest film thickness, and among the first layers and the second layers, excluding the first layer that contacts the semiconductor substrate, the second layer that contacts the metal layer has the largest film thickness.

Furthermore, a method for manufacturing a semiconductor device according to the present disclosure includes: a first step of forming the same number of first and second layers having conductivity alternately in order on a semiconductor substrate; and a second step of forming a metal layer on the second layer finally formed in the first step, wherein the first layer is composed of a material containing an element composing the semiconductor substrate, the second layer has higher adhesion to the metal layer than that of the first layer, in the first step, four or more layers including the first and second layers are consecutively formed using an ALD method in the same chamber, among the first layers and the second layers formed in the first step, excluding the second layer that contacts the metal layer, the first layer that contacts the semiconductor substrate has the largest film thickness, and among the first layers and the second layers, excluding the first layer that contacts the semiconductor substrate, the second layer that contacts the metal layer has the largest film thickness.

Advantageous Effects of Invention

In a semiconductor device and a method for manufacturing the semiconductor device according to the present disclosure, the first layer is composed of a material containing an element composing the semiconductor substrate. Among the first layers and the second layers, excluding the second layer that contacts the metal layer, the first layer that contacts the semiconductor substrate has the largest film thickness. Among the first layers and the second layers, excluding the first layer that contacts the semiconductor substrate, the second layer that contacts the metal layer has the largest film thickness. Therefore, adhesion between the semiconductor substrate and the adhesive layer can be prevented from deteriorating, and the film thickness of the adhesive layer can be kept small.

DESCRIPTION OF EMBODIMENTS

Embodiment 1

Figure 1:
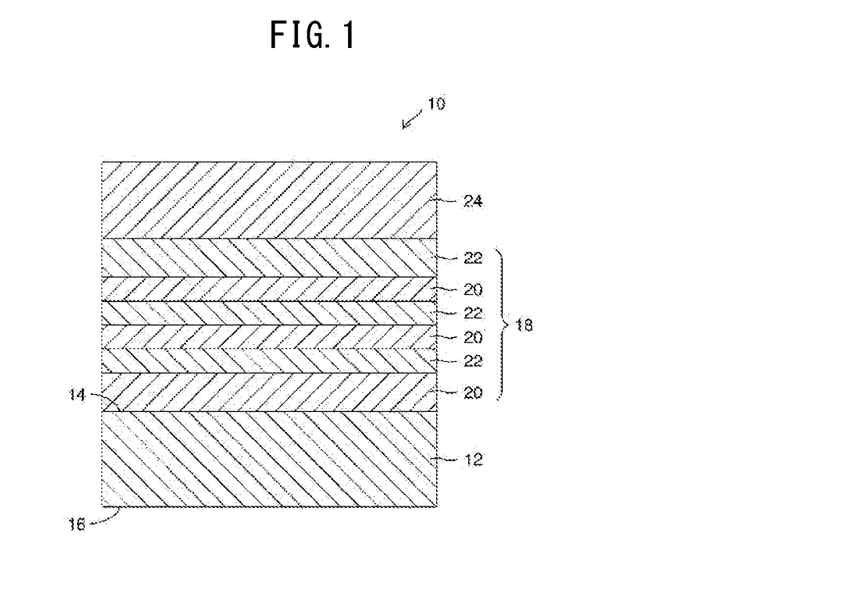
FIG. 1 is a cross-sectional view of a semiconductor device according to an embodiment 1.

A configuration of a semiconductor device according to an embodiment 1 will be described. The semiconductor device according to the embodiment 1 is a semiconductor device 10 illustrated in FIG. 1. FIG. 1 is a cross-sectional view of the semiconductor device 10.

The semiconductor device 10 includes a semiconductor substrate 12. The semiconductor substrate 12 includes a first surface 14 and a second surface 16 that oppose each other. The semiconductor substrate 12 is composed of SiC, for example.

An adhesive layer 18 is formed on the first surface 14 of the semiconductor substrate 12. In the adhesive layer 18, the same number of first and second layers 20 and 22 are alternately laminated in order from the first surface 14 side. Both the first layer 20 and the second layer 22 each have conductivity. The first layer 20 is composed of a material containing an element composing the semiconductor substrate 12, e.g., Si. The second layer 22 is composed of Ti, for example. The adhesive layer 18 may have a combination of the first and second layers 20 and 22, the total number of which is four or more, desirably six or more.

A metal layer 24 is formed on the adhesive layer 18. The metal layer 24 is composed of Au, for example. A material having higher adhesion to the metal layer 24 than that composing the first layer 20 is used for the second layer 22.

Among the first layers 20 and the second layers 22 constituting the adhesive layer 18, excluding the second layer 22 that contacts the metal layer 24, the first layer 20 that contacts the semiconductor substrate 12 has the largest film thickness. Among the layers excluding the first layer 20 that contacts the semiconductor substrate 12, the second layer 22 that contacts the metal layer 24 has the largest film thickness. The film thickness of the first layer 20 that contacts the semiconductor substrate 12 is 15 nm, for example. The film thickness of the first layer 20 that contacts the metal layer 12 is 15 nm, for example. The film thickness of the first layer 20 that contacts the semiconductor substrate 12 is desirably 10 nm or more to prevent a component of the second layer 22 above the first layer 20 from moving to the vicinity of an interface between the semiconductor substrate 12 and the first layer 20. Similarly, the film thickness of the second layer 22 that contacts the metal layer 24 is desirably 10 nm or more to prevent a component of the first layer 20 below the second layer 22 from moving to the vicinity of an interface between the metal layer 24 and the second layer 22. The respective film thicknesses of the first layer 20 and the second layer 22, which contact neither the semiconductor substrate 12 nor the metal layer 24, is 5 nm, for example.

A method for manufacturing the semiconductor device 10 will be described with reference to FIGS. 2A to 2D.

Figure 2A:
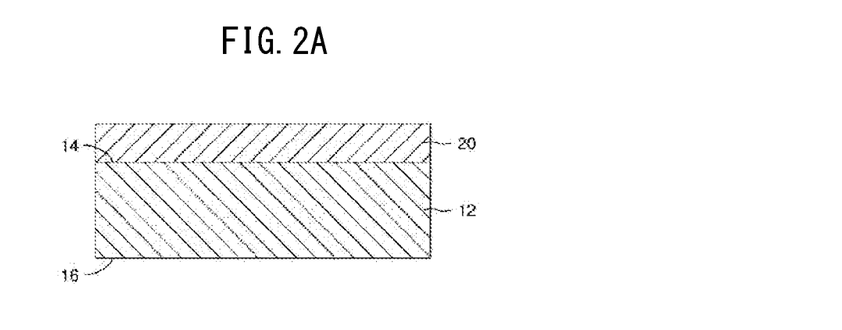
FIGS. 2A to 2D are cross-sectional views for explaining a method for manufacturing the semiconductor device according to an embodiment 1.

First, a first layer 20 is formed on a semiconductor substrate 12, as illustrated in FIG. 2A. The semiconductor substrate 12 is contained in a chamber, and the first layer 20 is formed using an ALD (atomic layer deposition) method.

Figure 2B:
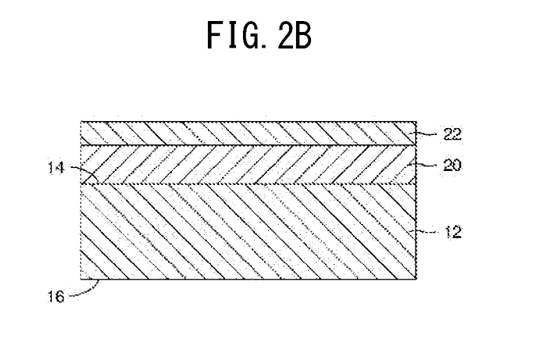

Then, a second layer 22 is formed on the first layer 20, as illustrated in FIG. 2B. Film formation is consecutively performed using the ALD method by switching a film formation material (precursor) in the same chamber as that at the time of film formation of the first layer 20.

Figure 2C:
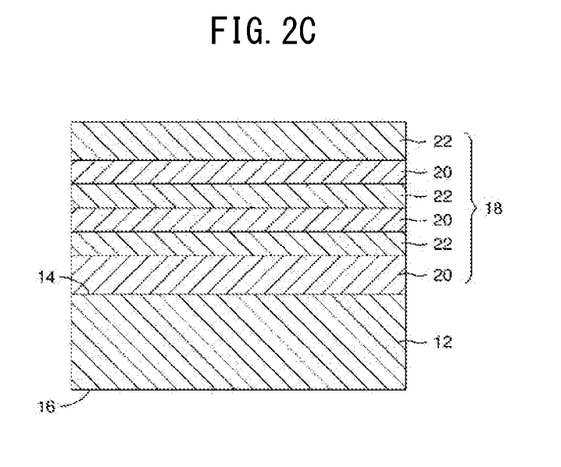

Then, first layers 20 and second layers 22 are alternately formed, as illustrated in FIG. 2C. Film formation is consecutively performed using the ALD method by switching a film formation material (precursor) in the same chamber as that at the time of the film formation of the first layer 20 and at the time of the film formation of the second layer 22.

An adhesive layer 18 is formed through the foregoing processes. The processes for forming the adhesive layer 18 are collectively referred to as a first process.

Figure 2D:
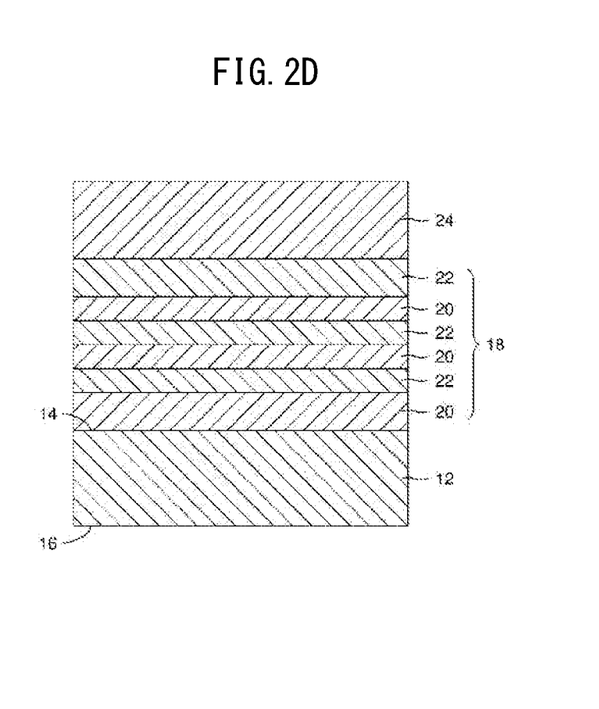

Then, a metal layer 24 is formed on the second layer 22 finally formed in the first process, as illustrated in FIG. 2D. This process is referred to as a second process. The metal layer 24 is formed using a sputtering method, an evaporation method, or a plating method, for example.

As described above, according to the embodiment 1, the first layer 20 is composed of a material containing an element composing the semiconductor substrate 12. Accordingly, the first layer 20 has high adhesion to the semiconductor substrate 12. In the adhesive layer 18, the first layer 20 contacts the semiconductor substrate 12. Thus, adhesion between the adhesive layer 18 and the semiconductor substrate 12 is high.

A material having higher adhesion to the metal layer 24 than that composing the first layer 20 is used for the second layer 22. Thus, adhesion between the adhesive layer 18 and the metal layer 24 is higher than that when the adhesive layer 18 is made to have a single-layer structure including only the first layers 20.

The adhesive layer 18 has a combination of the first and second layers 20 and 22, the total number of which is four or more. Thus, the number of interfaces in the adhesive layer 18 is three or more. Accordingly, even if a stress is applied to the adhesive layer, like when the semiconductor substrate is warped, the stress does not concentrate on the one interface.

Among the first layers 20 and the second layers 22 constituting the adhesive layer 18, excluding the second layer 22 that contacts the metal layer 24, the first layer 20 that contacts the semiconductor substrate 12 has the largest film thickness. Accordingly, a component of the second layer 22 above the first layer 20 that contacts the semiconductor substrate 12 is prevented from moving to the vicinity of the interface with the semiconductor substrate 12 through the first layer 20 due to diffusion or the like. Therefore, adhesion between the semiconductor substrate 12 and the adhesive layer 18 is prevented from deteriorating. Among the layers excluding the first layer 20 that contacts the semiconductor substrate 12, the second layer 22 that contacts the metal layer 24 has the largest film thickness. Accordingly, a component of the first layer 20 below the second layer 22 that contacts the metal layer 24 is prevented from moving to the vicinity of the interface with the metal layer 24 through the second layer 22 due to diffusion or the like. Therefore, adhesion between the metal layer 24 and the adhesive layer 18 is prevented from deteriorating.

Adhesion between the semiconductor substrate 12 and the metal layer 24 is thus prevented from deteriorating.

The respective film thicknesses of the layers other than the first layer 20 that contacts the semiconductor substrate 12 and the second layer 22 that contacts the metal layer 24 can be reduced. Thus, the film thickness of the entire adhesive layer can be kept small. Accordingly, an electrical resistance in a film thickness direction of the adhesive layer does not increase.

The first layers 20 and the second layers 22 constituting the adhesive layer 18 are continuously formed in the same chamber using an ALD method. Thus, the respective film thicknesses of the first layers 20 and the second layers 22 are uniform, cleanliness of the interfaces among the layers is good, and adhesion in the adhesive layer 18 is enhanced. The film thicknesses are uniform because an ALD method having good film thickness controllability is used. The cleanliness of the interfaces among the first layers 20 and the second layers 22 is good because film formation is continuously performed in the same chamber. Thus, the semiconductor device is not forced out of a chamber containing many impurities during the film formation. The cleanliness of the interfaces among the first layers 20 and the second layers 22 is thus good. Accordingly, the adhesion in the adhesive layer is enhanced.

Between the first process and the second process, there may be a process for performing heat treatment at a higher temperature than an upper-limit film formation temperature when forming the first layers and the second layers in the first process. In the ALD method, film formation cannot be performed at a higher temperature than a temperature at which the precursor is decomposed in a gas phase (an upper-limit film formation temperature). When heat treatment is performed at a higher temperature than the upper-limit film formation temperature after the first process and before the second process, the adhesion in the adhesive layer 18 is enhanced due to reaction, mutual diffusion, or the like between the layers in the adhesive layer 18. When the heat treatment is consecutively performed in an ALD device used in the first process, cleanliness of an uppermost surface of the adhesive layer 18 is enhanced. The upper-limit film formation temperature is approximately 450° C. when the precursor is TMA (trimethyl aluminum).

The first layers 20 and the second layers 22 may not be made of the same material, although made of entirely the same material in the adhesive layer 18. For example, the first layers 20 and the second layers 22 may have a laminate structure in which the first layers 20 are composed of Si or WSi and the second layers 22 are composed of Ti or Ni such that Si, Ti, Si, Ti, WSi, Ni, WSi, and Ni are formed in this order from the lowermost layer.

Although the ALD method is used for the film formation of the first layers 20 and the second layers 22, the film formation may be performed using a sputtering method, an evaporation method, or a CVD (chemical vapor deposition) method, for example. In the case, an effect of preventing the adhesion between the semiconductor substrate 12 and the metal layer 24 from deteriorating is also obtained.

Not only a metal but also a material having conductivity such as an alloy or polysilicon may be used for the metal layer 24.

Embodiment 2

A semiconductor device according to an embodiment 2 will be described. The semiconductor device according to the embodiment 2 differs from the semiconductor device 10 according to the embodiment 1 in that it includes a semiconductor substrate in which a via hole is formed. A difference from the embodiment 1, including this point, will be mainly described.

Figure 3:
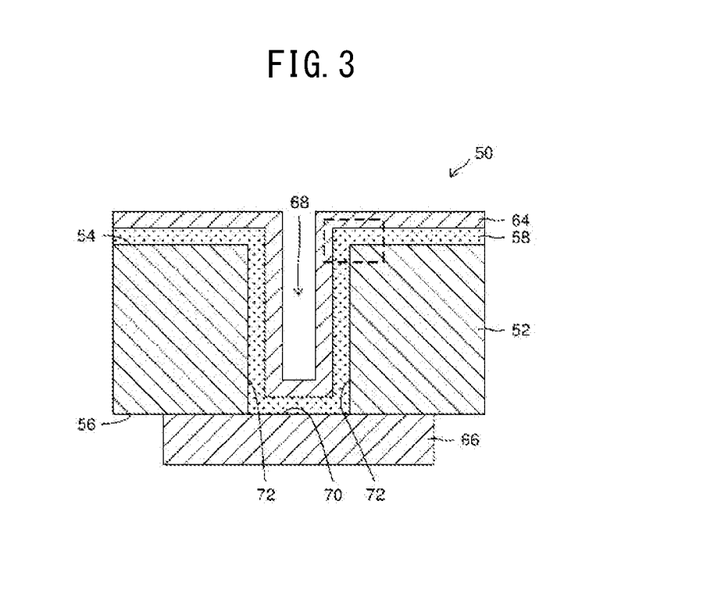
FIG. 3 is a cross-sectional view of a semiconductor device according to an embodiment 2.

A configuration of the semiconductor device according to the embodiment 2 will be described. The semiconductor device according to the embodiment 2 is a semiconductor device 50 illustrated in FIG. 3. FIG. 3 is a cross-sectional view of the semiconductor device 50.

The semiconductor device 50 includes a semiconductor substrate 52. The semiconductor substrate 52 includes a first surface 54 and a second surface 56 that oppose each other. The semiconductor substrate 52 is composed of SiC, for example.

The semiconductor substrate 52 has a via hole 68 provided therethrough from the first surface 54 to the second surface 56.

The second surface 56 of the semiconductor substrate 52 is provided with an electrode 66 that covers the via hole 68. The electrode 66 is composed of Ti/Au, for example.

An adhesive layer 58 is formed on a surface 70, which faces the via hole 68, of the electrode 66, a side surface 72 of the via hole 68, and the first surface 54. A laminate structure 18 in the adhesive layer 58 is similar to the adhesive layer 18 in the embodiment 1. In FIG. 3, illustration of the laminate structure in the adhesive layer 58 is omitted.

A metal layer 64 is formed on the adhesive layer 58. The metal layer 64 is composed of Au, for example.

Figure 4:
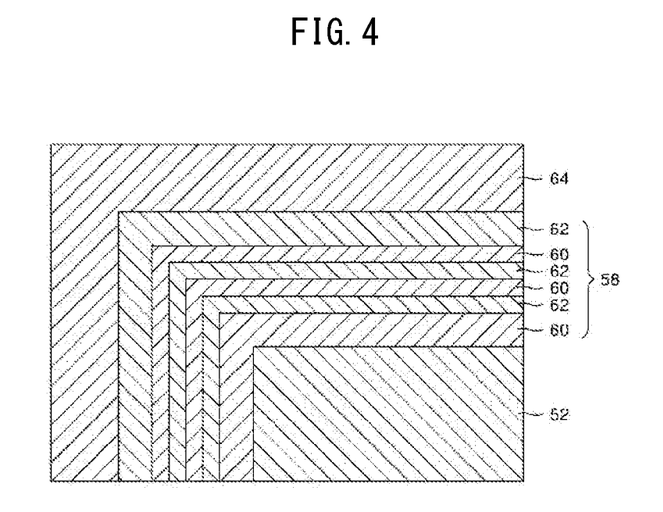
FIG. 4 is a view obtained by enlarging a part of FIG. 3.

FIG. 4 is obtained by enlarging a region surrounded by a broken line illustrated in FIG. 3. In FIG. 4, the laminate structure in the adhesive layer 58 is drawn. In the adhesive layer 58, the same number of first and second layers 60 and 62 are alternately laminated toward the metal layer 64 from the substrate 52 side. Both the first layer 60 and the second layer 62 each have conductivity. The first layer 60 is composed of a material containing an element composing the semiconductor substrate 52, e.g., Si. A material having higher adhesion to the metal layer 64 than that composing the first layer 60 is used for the second layer 62. The adhesive layer 58 may have a combination of the first and second layers 60 and 62, the total number of which is four or more, desirably six or more. Among the layers excluding the second layer 62 that contacts the metal layer 64, the first layer 60 that contacts the semiconductor substrate 12 has the largest film thickness. Among the layers excluding the first layer 60 that contacts the semiconductor substrate 52, the second layer 62 that contacts the metal layer 64 has the largest film thickness.

A method for manufacturing the semiconductor device 50 will be described with reference to FIGS. 5A to 5D.

Figure 5A:
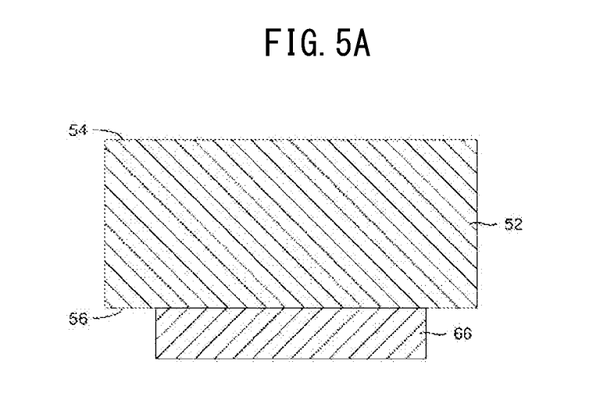
FIGS. 5A to 5D are cross-sectional views for explaining a method for manufacturing the semiconductor device according to an embodiment 2.

In the method for manufacturing the semiconductor device 50, an electrode 66 is first formed on a second surface 56 of a semiconductor substrate 52, as illustrated in FIG. 5A. The electrode 66 is formed using a sputtering method, an evaporation method, or a plating method, for example.

Figure 5B:
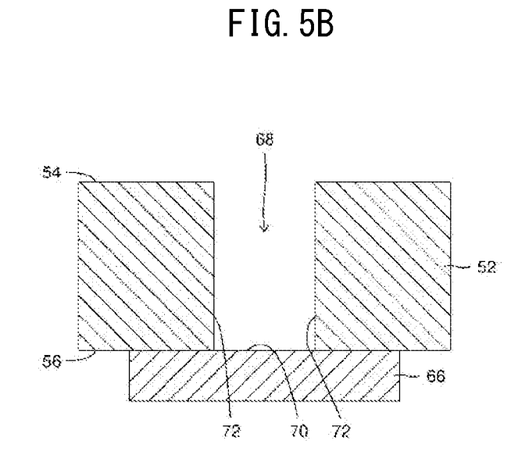

Then, the semiconductor substrate 52 is etched up to the electrode 66 from the first surface 54 side, to form a via hole 68, as illustrated in FIG. 5B.

Figure 5C:
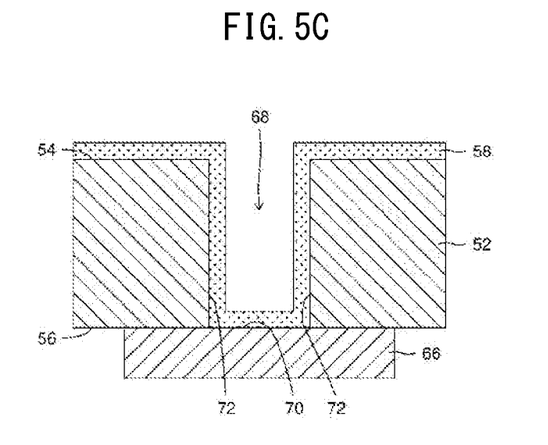

Then, an adhesive layer 58 is formed on a surface 70, which faces the via hole 68, of the electrode 66, a side surface 72 of the via hole 68, and a first surface 54, as illustrated in FIG. 5C. Although illustration of a laminate structure in the adhesive layer 58 is omitted in FIG. 5C, the adhesive layer 58 is obtained by alternately laminating first layers 60 and second layers 62 from the semiconductor substrate 52 side, like the adhesive layer 18 in the embodiment 1. The lamination is consecutively performed in the same chamber using an ALD method. A process for forming the adhesive layer 58 is referred to as a first process.

Figure 5D:
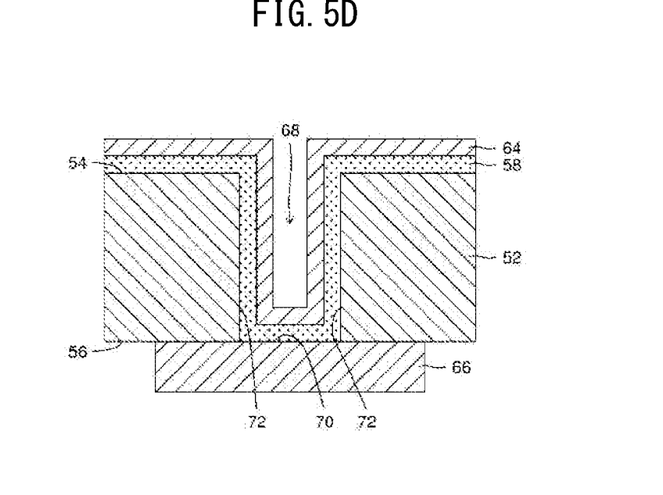

Then, a metal layer 64 is formed on the adhesive layer 58, i.e., on the second layer 62 finally formed in the first process, as illustrated in FIG. 5D. This process is referred to as a second process. The metal layer 64 is formed using a sputtering method, an evaporation method, or a plating method, for example.

As described above, according to the embodiment 2, a similar effect to that in the embodiment 1 is obtained. Particularly, if an SiC substrate is used as the semiconductor substrate 52, and a high-frequency device using gallium nitride (GaN) is formed on the second surface 56 side of the semiconductor substrate 52, adhesion between the semiconductor substrate 52 and the metal layer 64 may be low. Thus, an application of the embodiment is effective for preventing the adhesion from deteriorating.

REFERENCE SIGNS LIST 10,50 semiconductor device
12,52 semiconductor substrate
14,54 first surface
16,56 second surface
18,58 adhesive layer
20,60 first layer
22,62 second layer
24,64 metal layer
66 electrode
68 via hole
70 surface
72 side surface

The invention claimed is:

1. A semiconductor device comprising:
a semiconductor substrate including a first surface and a second surface that oppose each other;
an adhesive layer in which the same number of first and second layers having conductivity are alternately laminated in order on the first surface; and
a metal layer formed on the adhesive layer,
wherein the first layer is composed of a material containing an element composing the semiconductor substrate,
the second layer has higher adhesion to the metal layer than that of the first layer,
the adhesive layer has four or more layers including the first and second layers,
among the first layers and the second layers constituting the adhesive layer, excluding the second layer that contacts the metal layer, the first layer that contacts the semiconductor substrate has the largest film thickness, and
among the first layers and the second layers, excluding the first layer that contacts the semiconductor substrate, the second layer that contacts the metal layer has the largest film thickness.

2. The semiconductor device according to claim 1, wherein both the first layer that contacts the semiconductor substrate and the second layer that contacts the metal layer have a film thickness of 10 nm or more.

3. The semiconductor device according to claim 2, wherein the semiconductor substrate has a via hole provided therethrough from the first surface to the second surface,
an electrode is provided on the second surface and covers the via hole, and
the adhesive layer is formed on a surface, which faces the via hole, of the electrode, a side surface of the via hole, and the first surface.

4. The semiconductor device according to claim 1, wherein the semiconductor substrate has a via hole provided therethrough from the first surface to the second surface,
an electrode is provided on the second surface and covers the via hole, and
the adhesive layer is formed on a surface, which faces the via hole, of the electrode, a side surface of the via hole, and the first surface.

5. A method for manufacturing a semiconductor device comprising:
a first step of forming the same number of first and second layers having conductivity alternately in order on a semiconductor substrate; and
a second step of forming a metal layer on the second layer finally formed in the first step,
wherein the first layer is composed of a material containing an element composing the semiconductor substrate,
the second layer has higher adhesion to the metal layer than that of the first layer,
in the first step, four or more layers including the first and second layers are consecutively formed using an ALD method in the same chamber,
among the first layers and the second layers formed in the first step, excluding the second layer that contacts the metal layer, the first layer that contacts the semiconductor substrate has the largest film thickness, and
among the first layers and the second layers, excluding the first layer that contacts the semiconductor substrate, the second layer that contacts the metal layer has the largest film thickness.

6. The method for manufacturing a semiconductor device according to claim 5, further comprising, between the first step and the second step, a step of performing heat treatment at a higher temperature than an upper-limit film formation temperature when forming the first and second layers in the first step.

* * * * *